US 7,257,802 B2

(12) United States Patent
Daw et al.

(10) Patent No.: US 7,257,802 B2
(45) Date of Patent: Aug. 14, 2007

(54) METHOD AND SYSTEM FOR HARDWARE ACCELERATED VERIFICATION OF DIGITAL CIRCUIT DESIGN AND ITS TESTBENCH

(75) Inventors: Jyotirmoy Daw, Noida (IN); Sanjay Gupta, Noida (IN); Suresh Krishnamurthy, Noida (IN)

(73) Assignee: Mentor Graphics Corporation, Wilsonville, OR (US)

( * ) Notice: Subject to any disclaimer, the term of this patent is extended or adjusted under 35 U.S.C. 154(b) by 52 days.

(21) Appl. No.: 10/972,361

(22) Filed: Oct. 26, 2004

(65) Prior Publication Data

US 2005/0144585 A1    Jun. 30, 2005

(30) Foreign Application Priority Data

Dec. 29, 2003  (IN)  ............... 1632/Del/2003

(51) Int. Cl.
*G06F 17/50* (2006.01)
(52) U.S. Cl. ............... 716/18; 716/2; 716/4; 703/14
(58) Field of Classification Search .......... 716/1, 716/2, 4, 7, 18; 703/14
See application file for complete search history.

(56) References Cited

U.S. PATENT DOCUMENTS 5,555,201 A * 9/1996 Dangelo et al. ............ 716/1

2004/0111252 A1   6/2004 Burgun et al.
2005/0198606 A1 * 9/2005 Gupta et al. ............... 716/18

OTHER PUBLICATIONS

Mike Santarini of EE Times entitled Testbench Integrated on Emulator (May 24, 2004), printed Jul. 27, 2004, 3 pages, http://www.eedesign.com/news/showArticle.jhtml?articleId=20900488&kc=4217, San Jose, California.
Mike Santarini of EE Times entitles Axis Adds Assertion Checking to Emulation/Acceleration (Aug. 19, 2002), printed Jul. 27, 2004, 4 pages, http://www.eedesign.com/news/showArticle.jhtml?articleId=17407909&kc=4217.
Mike Santarini of EE Times entitled Axis' Xtreme Gets Behavioral Boost (Oct. 18, 2001), printed Jul. 27, 2004, 2 pages, http://www.us.design-reuse.com/news/news332.html.

(Continued)

Primary Examiner—Thuan Do
(74) Attorney, Agent, or Firm—Banner & Witcoff, Ltd.

(57) ABSTRACT

A system and method is presented for synthesizing both a design under test (DUT) and its test environment (i.e., the testbench for the DUT), into an equivalent structural model suitable for execution on a reconfigurable hardware platform. This may be achieved without any change in the existing verification methodology. Behavioral HDL may be translated into a form that can be executed on a reconfigurable hardware platform. A set of compilation transforms are provided that convert behavioral constructs into RTL constructs that can be directly mapped onto an emulator. Such transforms are provided by introducing the concepts of a behavioral clock and a time advance finite state machine (FSM) that determines simulation time and sequences concurrent computing blocks in the DUT and the testbench.

22 Claims, 16 Drawing Sheets

OTHER PUBLICATIONS

Xtreme-II: The First Verification Environment for Platform Verification, printed Jul. 27, 2004, 3 pages, http://www.verisity.com/products/xtremeii.html.

Testbench Acceleration: Synthesizing e Testbenches Using Versity's eCelerator, printed on Jul. 27, 2004, 6 pages, http://www.verisity.com/resources/whitepaper/accelration.html.

Accelerated Verification Process Automation, printed on Jul. 27, 2004, 6 pages, http://www.verisity.com/resources/whitepaper/spextreme.html.

SpeXtreme: VPA System for High Performance Chip- and System-Level Verification, printed on Jul. 27, 2004, 2 pages, http://www.verisity.com/products/spextreme.html.

* cited by examiner ta = Time Advancing Cycle
in = Internal Time Stopping Cycle
bl = Blocking Cycle
nb = Non-blocking Cycle

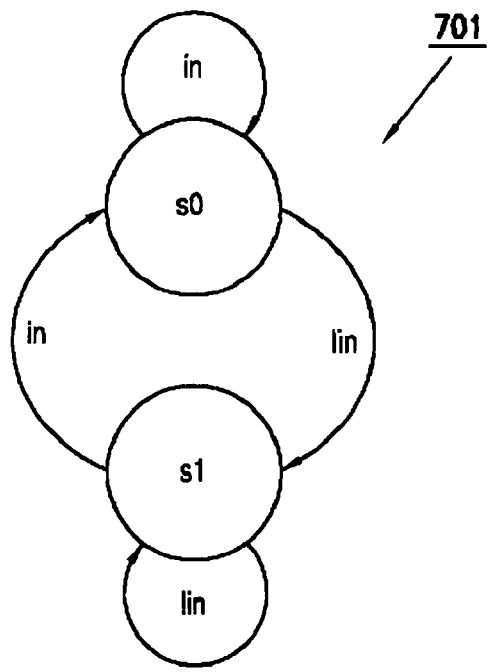
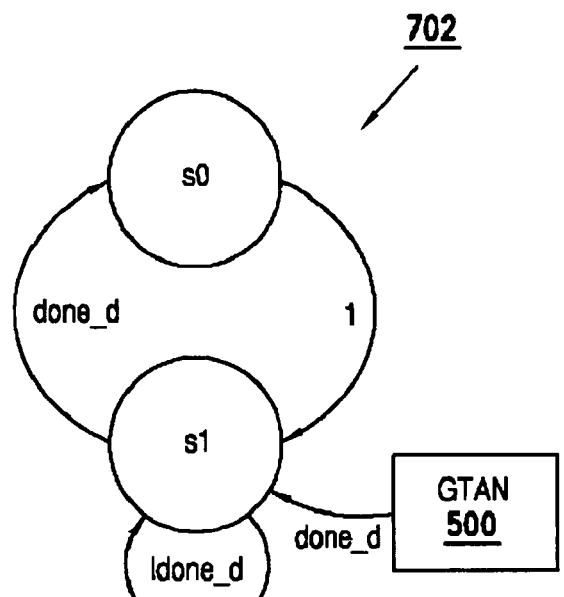
FIG. 7A  FIG. 7B
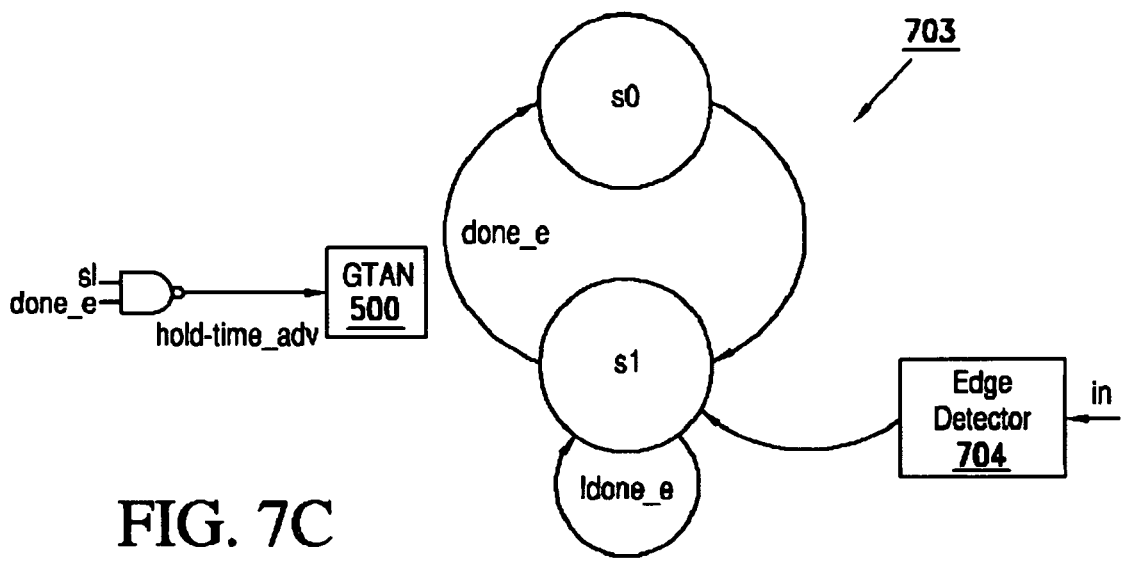
FIG. 7C

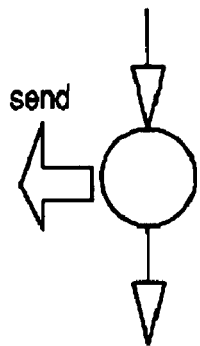
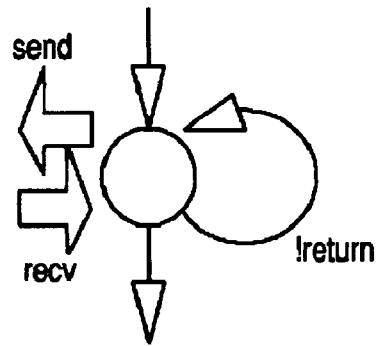
One-way task
($display)
Two-way task
($random)
FIG. 9
FIG. 10
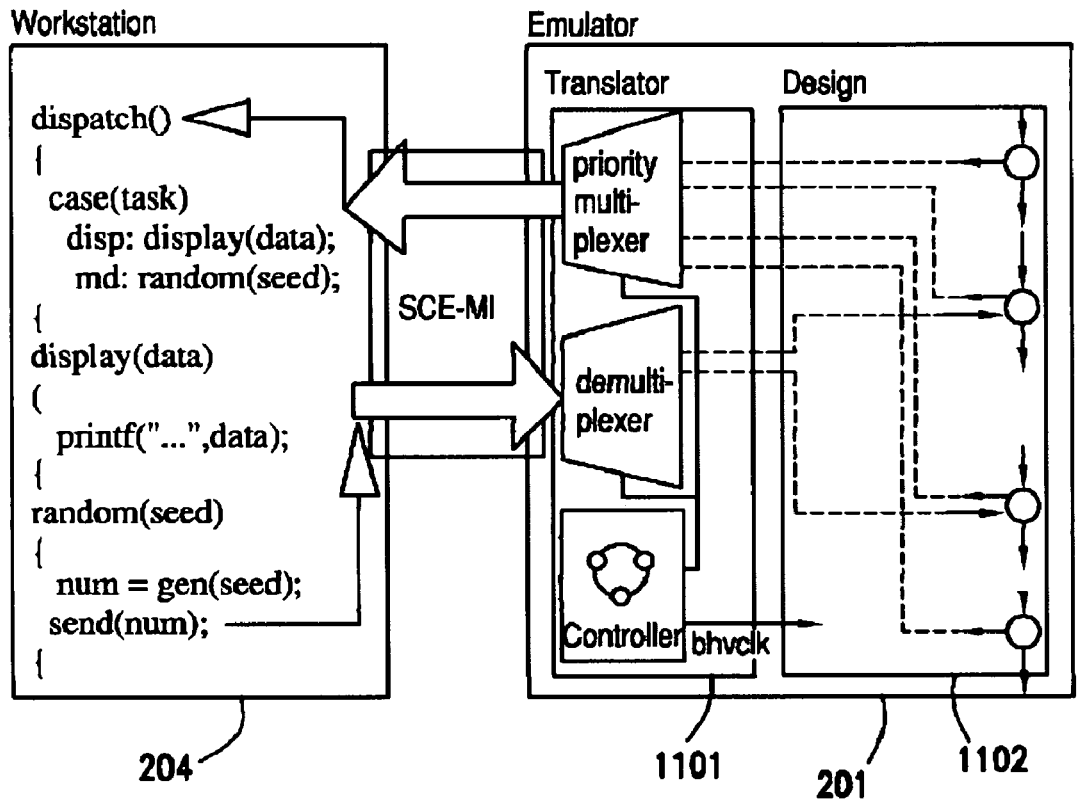
FIG. 11

METHOD AND SYSTEM FOR HARDWARE ACCELERATED VERIFICATION OF DIGITAL CIRCUIT DESIGN AND ITS TESTBENCH

FIELD OF THE INVENTION

The present invention relates to the field of verification tools for hardware circuit design. More specifically, the invention relates to the field of synthesis for hardware-assisted verification.

BACKGROUND OF THE INVENTION

Hardware Description Languages (HDLs) are predominantly used to describe integrated circuit designs. Various HDLs exist in the market today such as Very High Speed Integrated Circuit HDL (VHDL), Verilog, and System Verilog. HDL may be used to describe a design at various levels of abstraction. For instance, VHDL supports many possible levels/styles of design description. These styles differ primarily in how closely they relate to the underlying hardware. Some levels focus more on the behavior and dataflow of a design, while other levels focus more on the structural and timing aspects of the design.

For example, integrated circuit designs may be described at the dataflow level of abstraction, often called the register transfer level (RTL). In this intermediate level of abstraction, a design is described in terms of how data moves through the design. At the heart of most digital systems today are registers, and an RTL model describes how information is passed between registers in the design. This movement is synchronized at specific points of time which are indicated by the changes of values of a special design signal commonly known as a clock. Typically, while an RTL model of the combinational logic portions of the design is described at a relatively high level, the timing and operation of registers in the design are described more specifically. RTL is therefore an intermediate level that allows the drudgery of combinational logic to be simplified (and automatically generated by logic synthesis tools) while the more important parts of the circuit, the registers, are more completely specified. Once the design is specified in an RTL model, RTL synthesis tools translate, or synthesize, this model into a still lower level model of abstraction, i.e., into a gate-level structural model. Synthesis refers to the process of transformation of a design model from a higher level of abstraction to a lower level. These transformations typically try to improve upon a set of objective metrics (e.g., area, speed, power dissipation) of a design.

Once a design has been described, the design is typically verified for proper functionality prior to physical fabrication as an integrated circuit chip. While being tested, an HDL model of a design is called a Design Under Test (DUT). This DUT (which is an RTL design model) is simulated using a testbench. The testbench generates a set of input test vectors, or stimuli, and applies the stimuli to the DUT. The testbench also reads a set of output test vectors from the DUT in response to the stimuli. The testbench collects the responses made by the DUT against a specification of correct results. A testbench in its traditional form is described at a behavioral level and defines the environment for the DUT in its target system. Behavioral HDL, which is the currently highest level of abstraction supported in HDL, describes a design in terms of what it does (or how it behaves) rather than in terms of its structural components and interconnection between them. To do so, a behavioral model specifies a relationship between signals within the design as well as inputs to and outputs from the design. When creating a behavioral model of a design, one describes the operation of the design over time. The usage of time is a critical distinction between behavioral descriptions of circuits and lower-level descriptions such as a dataflow level of abstraction.

In a behavioral description, time may be expressed precisely as absolute delays between related events (such as the propagation delays within gates and on wires), or time may be a factor by defining the sequential ordering of events. Synthesis tools currently attempt to transform behavioral HDL models into lower-level HDL models. However, synthesis tools presently do not attempt to maintain the identical behavior in actual circuitry as defined in the behavioral model. In other words, exact time sequencing of the design elements are not preserved in synthesis. Therefore, such synthesis tools can not be used for synthesizing behavioral testbenches.

Design verification may be performed using a variety of methods. For example, software based simulators are the most commonly used verification tools. Software simulators have an advantage in that they can accept HDL at any level of abstraction, such as a behavioral level of abstraction, thus providing a way to simulate both a DUT (in RTL) and its testbench (in behavioral description). However, simulators have a disadvantage in that, for large designs, simulators typically can achieve a speed of not more than a few tens to hundreds of clock cycles per second (cps).

To increase the overall simulation speed, co-simulation approaches have been used, in which the behavioral testbench runs on a software simulator and the RTL DUT is executed onto a reconfigurable hardware platform. The reconfigurable hardware platform may be implemented as, e.g., a plurality of reconfigurable hardware elements, such as a set of general-purpose processors and/or Field Programmable Gate Arrays (FPGAs).

To execute the DUT on the reconfigurable hardware platform (referred to as an emulator), the RTL model of the DUT is first translated into a structural model using an RTL synthesis tool. This structural model, known as a netlist, describes a circuit in terms of interconnection of gate level components.

The structural level, as mentioned, describes a system as a collection of logic gates and their interconnection to perform a desired function. It is a representation that is closer to the physical realization of a system. Thereafter, the emulator runs the structural level description of the DUT at the actual binary gate levels and is therefore, considerably faster than a simulator being used for the same purpose. However, the testbenches in a co-simulation approach are still written in a behavioral HDL and are run on a software platform/simulator. The emulator and the simulator have to communicate with each other in order to maintain synchronization with each other. Such frequent communication taxes the resources of the emulator and simulator, thus reducing the potential speed at which the system may operate. Because of this limitation, co-simulation speed is typically only 3 to 10 times of the software simulation speed. Co-simulation has another disadvantage that they require memories that have to be re-modeled in terms of the memories available in the emulator.

SUMMARY OF THE INVENTION

Aspects of the present invention may overcome one or more of the drawbacks of the prior art by synthesizing the DUT itself and the test environment (i.e., the testbench for the DUT), into an equivalent structural model suitable for execution on a reconfigurable hardware platform, thereby attaining faster verification of the design.

Aspects of the present invention further achieve the correct and optimal verification of the chip on a reconfigurable hardware platform where the Testbench is also executed on the reconfigurable computing platform.

Still further aspects of the present invention are directed to achieving one or more of the aforementioned without any change in the existing verification methodology.

To achieve the aforementioned, aspects of the present invention provide for translating behavioral HDL into a form that can be executed on a reconfigurable hardware platform. A set of compilation transforms are provided that convert behavioral constructs into RTL constructs that can be directly mapped onto an emulator. Such transforms are provided by introducing the concepts of a behavioral clock and a time advance finite state machine (FSM) that determines simulation time and sequences concurrent computing blocks in the DUT and the testbench. For example, behavioral timing constructs may translate directly into one or more small FSMs that are clocked by the behavioral block, with inputs and/or outputs to the time-advance FSM. Behavioral looping constructs, which may be unbounded in space and/or depth, may be converted into RTL, which is bounded. Such a conversion may occur through the introduction of behavioral block registers to break loop iterations, and the provision for a zero time-advance mechanism within the time advance FSM. Behavioral system tasks may be converted into communication infrastructures along with message transport to/from a host, similarly using a zero time-advance mechanism while awaiting a return message. Thus, a source behavioral HDL model may be synthesized into a generic structural representation for parallel hardware execution of concurrent blocks and a global scheduler specific to the design to control synchronization between the concurrent blocks. The design may further be partitioned into multiple portions, where some portions are executed on a software platform. Also, an interface may be provided between the reconfigurable hardware platform and the computing platform.

Thus, aspects of the present invention allow the simulation performance barrier to be broken by eliminating or reducing the need to run behavioral testbenches on a software simulator. The entire design and testbench can now run on a hardware platform, achieving much better simulation performance. For instance, verification may now be run at speeds up to several hundred thousand cps. The larger the design size, the better the performance gain, since the speed of execution on the hardware platform may be independent of design size. A benefit of this is that designers and verification engineers may achieve such a gain without any changes to their current verification methodology.

Further objects, features and other aspects of this invention will be understood from the following detailed description of illustrative embodiments with reference to the attached figures.

BRIEF DESCRIPTION OF THE DRAWINGS

FIGS. 7A, 7B and 7C show illustrative finite state machine states for various timing control statements in accordance with at least one aspect of the present invention.

FIGS. 9 and 10 show one-way and two-way system tasks in accordance with at least one aspect of the present invention.

FIG. 11 shows the system task infrastructure in accordance with at least one aspect of the present invention.

DETAILED DESCRIPTION OF ILLUSTRATIVE EMBODIMENTS

Figure 1:
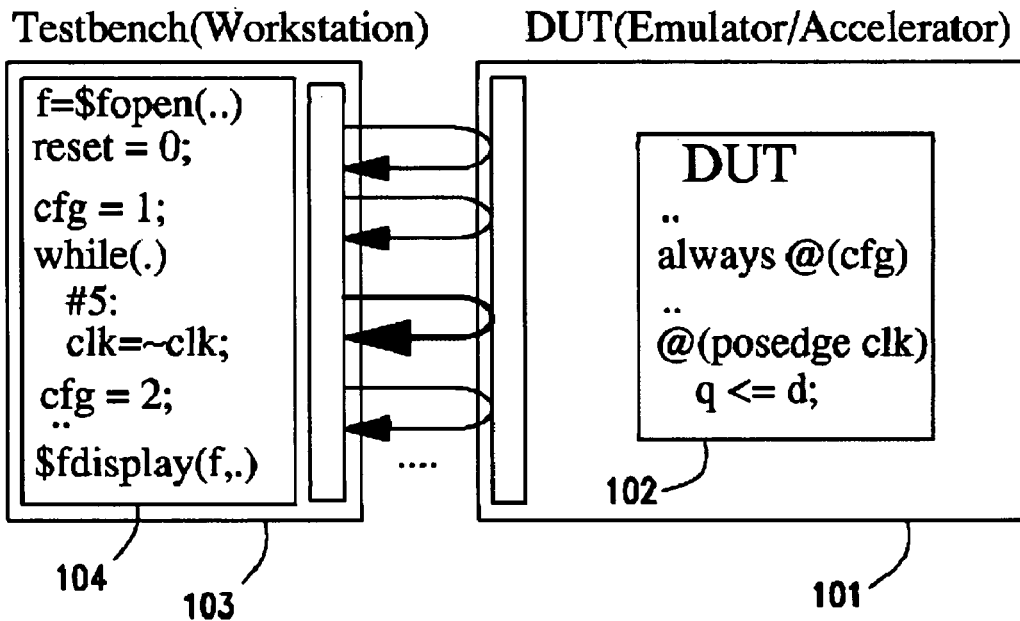
FIG. 1 is a functional block diagram of a conventional co-simulation configuration.

Modern verification often uses a co-simulation approach. In a co-simulation approach, as shown in FIG. 1, a testbench 104 (which is coded in a behavioral level of abstraction) runs on a software platform 103, and a DUT 102 (coded in RTL) is mapped to a reconfigurable hardware platform 101.

Unfortunately, due to high communication overheads (both platforms need to synchronize every time simulation-time/delta-cycles advance in simulation), the simulation speed improvement has remained within a few multiple (3-10×) of the software simulation speed for most designs.

As already mentioned, the DUT 102 may be modeled at the RTL level of abstraction. Traditional RTL synthesis tools synthesize such models into structural forms that can be directly mapped onto the reconfigurable elements of the emulator. The testbench 104 is generally written in behavioral HDL, which conventionally cannot be executed on emulators because the available synthesis tools can only translate RTL models into structural forms.

However, aspects of the present invention allow behavioral HDL models in general and testbenches in particular to be translated into structural forms suitable for execution on emulators. Testbench synthesis differs from behavioral synthesis in many ways. Its objective is to achieve correct and optimal execution of the testbench on a hardware platform and not actual implementation on a silicon device. It allows a more relaxed modeling style in the input description, and at the same time matches all of the HDL simulation semantics. Additional complexities over behavioral synthesis include matching software simulation semantics whenever possible, and even in all cases. For example, last-driver-win semantics in the case of multiple drivers, delta delay semantics and optimal execution of testbench-specific constructs such as #delays, $time, force-release, etc. Even though there has been research on behavioral synthesis, nobody has yet to achieve it successfully.

Figure 2:
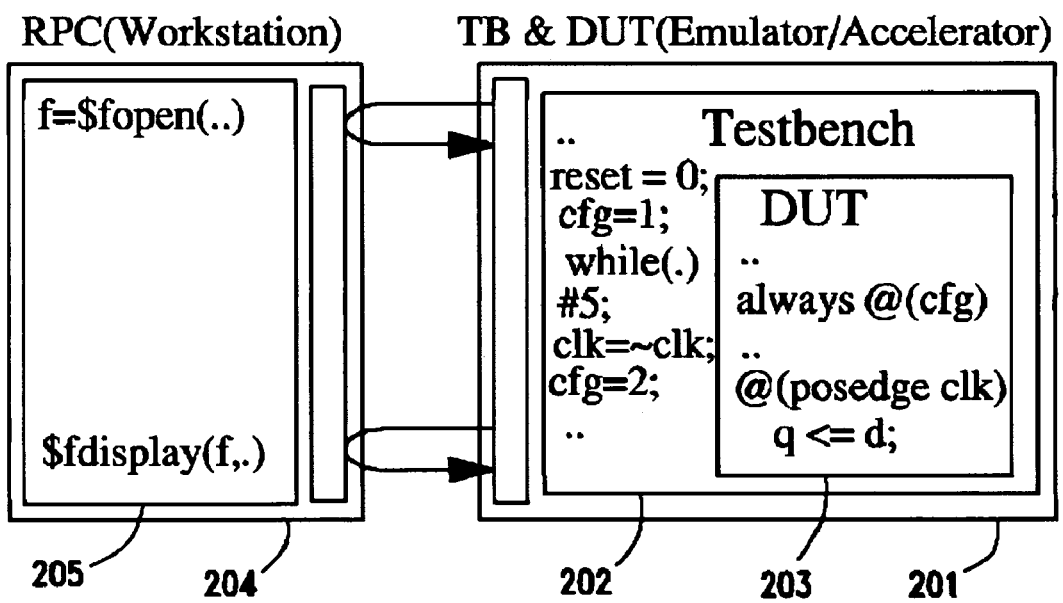
FIG. 2 is a functional block diagram of an illustrative verification system in accordance with at least one aspect of the present invention.

Accordingly, FIG. 2 shows an example of a configuration where the entire simulation model including a DUT 203 and a testbench 202 has been mapped onto a reconfigurable hardware platform 201. A workstation 204 handles system calls that require dynamic support of the operating system (like file I/O, display, etc.) made by the model.

The reconfigurable hardware platform 201 has both the DUT 203 and its testbench 202 mapped onto it. This mapped model of the DUT 203 and the testbench 202 may need to communicate with the workstation 204 for system tasks such as file IO, display, etc. In this example, these system tasks are handled at the workstation 204 by a software application 205 written in a High Level Verification Language (HVL). At the workstation 204, a software simulator is not required. Instead, an automatically generated design specific HVL model (using, e.g., C++) may be used that executes system tasks. Communication between the software application 205 and the mapped model 202, 203 is implemented by a software interface layer 206 through a standard co-emulation modeling interface (SCE-MI) 207.

Figure 3:
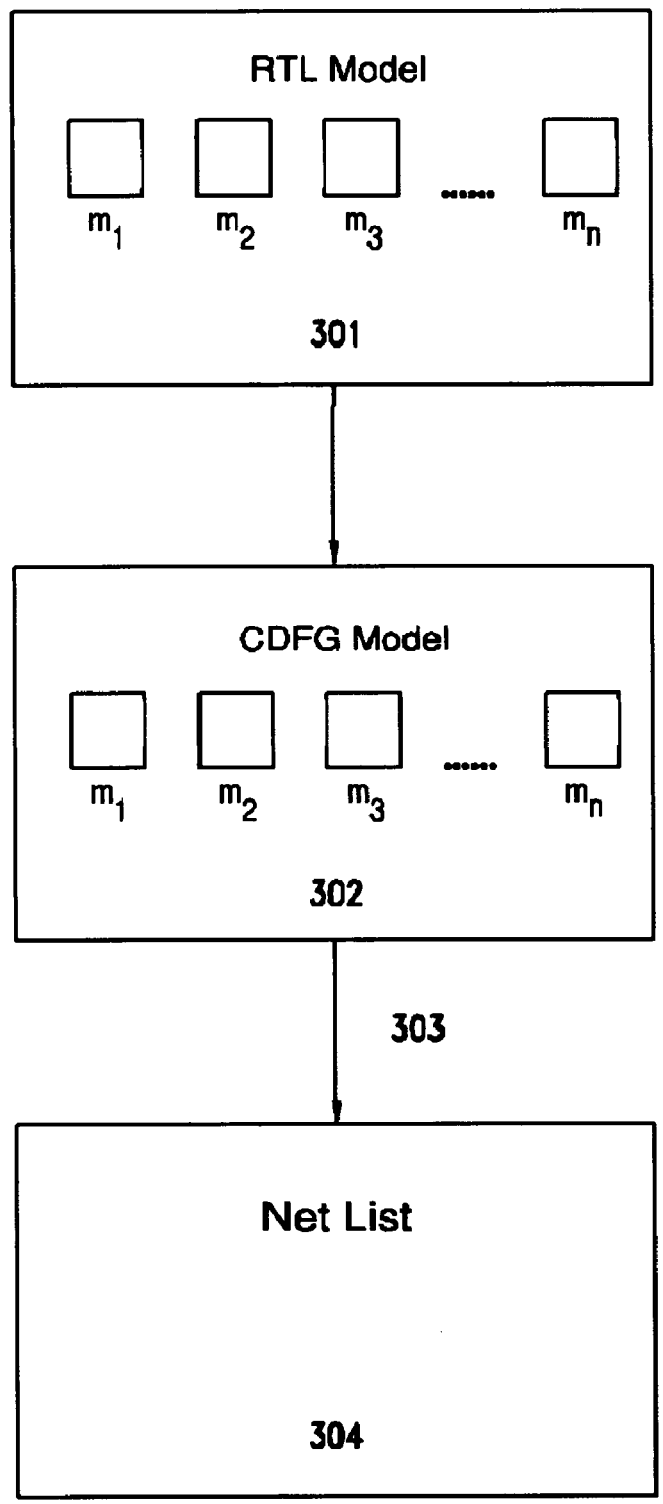
FIG. 3 is a flowchart depicting illustrative steps of RTL synthesis in accordance with at least one aspect of the present invention.

FIG. 3 illustrates an illustrative high-level flow of a synthesis tool for conversion of RTL into a structural form suitable for mapping onto a reconfigurable hardware platform. An input HDL description 301, having a plurality of sub-modules $m_1, m_2, m_3 \ldots m_n$, is converted into a set of RTL Control Data Flow Graphs (CDFG) 302 for each of the sub-modules $m_1, m_2, m_3 \ldots m_n$. This intermediate CDFG model 302 is then mapped to a gate level netlist 304 through known mapping and optimization techniques 303. Reconfigurable hardware platforms typically accept and implement such gate level netlist formats. The RTL model 301, in which the DUT is typically defined, is a synchronous model and is therefore easily convertible into the CDFG model 302, which is further easily convertible into the gate level netlist 304.

On the other hand, a behavioral HDL model, in which a testbench is typically defined, is inherently asynchronous. This means that the conversions shown in FIG. 3 are not conventionally applicable to testbench synthesis. At a macro level, a behavioral HDL model may be visualized as a group of concurrent blocks generating events and executing statements that are asynchronous to one another. To synthesize a behavioral HDL model into an implementable netlist, a new clock, called herein a "behavioral clock," is introduced. The behavioral clock is sufficiently fast such that it may be aligned to coincide with each needed asynchronous event, thereby effectively causing each asynchronous event to be synchronous with respect to the behavioral clock.

Figure 4:
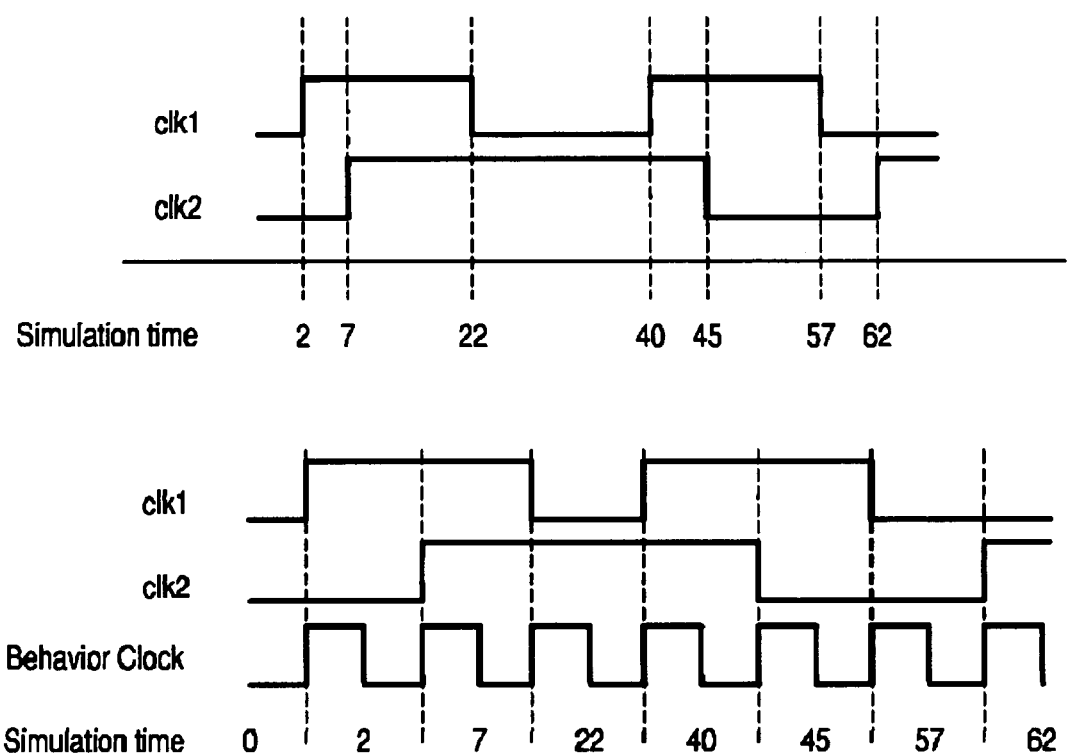
FIG. 4 is an illustrative waveform diagram showing how asynchronous events may be made synchronous with respect to a fast running clock, in accordance with at least one aspect of the present invention.

For example, FIG. 4 is an illustrative waveform diagram showing how asynchronous events are made synchronous with respect to the behavioral clock. All emulation activities (e.g. signal value changes, time advance, zero delay execution, etc.) are synchronized to the edges of the behavioral clock. The network produces an ordered set of time points, on successive behavioral clock cycles, corresponding to the precise time points needed by any of the computations within the testbench or DUT. Thus, any time point needed by any computation is associated with one or more behavioral clock cycles. Time points that are not needed by any computation may be skipped. In this way, the transformed behavioral model may now be modeled as a multi-cycle, implicit style finite state machine (FSM).

Each concurrent procedural block in the behavioral model may be converted into a FSM, and each timing control statement for each concurrent procedural block may be mapped to a state in the respective FSM. These FSM states transition according to the sequential execution order of the statements within the concurrent procedural blocks, and the FSMs are clocked by the behavioral clock. All such statements are executed in sequence, where one time controlling group of statements passes the control flow to the next group of statements in the form of a DONE signal, which in turn becomes the START signal for the next statement. In each of these FSMs, some of the states may advance the simulation time and some may not. A counter controlled by the FSMs maintains the current simulation time.

For the correct sequencing to occur among the concurrent procedural blocks, the states associated with the timing-control statements may transition to their next state at the appropriate time with respect to similar state transitions in others of the concurrent procedural blocks. Wait/event control statements may be generated depending on design signal value changes, and simple next state transition logic may be used to sequence the control statements.

For delay-control statements, special inter-connecting logic, referred hereinafter as a global time advance network (GTAN), is introduced. The GTAN network may also be modeled as a FSM running on the behavioral clock. The GTAN network may maintain a complete timing queue in the reconfigurable hardware platform. At a particular time in the simulation time, different ones of the concurrent procedural blocks (such as always/initial blocks) contributing different delays may be inserted in this queue.

As mentioned earlier, the behavioral testbench is converted into an equivalent FSM (or set of FSMs) running on the behavioral clock. Each simulation time state controlling a group of statements (such as #, @, or wait) represents a state in the FSM and is referred to as a time advancing state. When delta cycles (i.e., cycles that do not advance the simulation time) need to be executed (for zero delay loops or event chains, or for non-blocking assignments maturing etc.) the corresponding FSM enters in a simulation time stopping state.

When an FSM is in a time advancing state, the FSM contributes a non-zero delay value to the GTAN. During the simulation cycles, if more than one FSM in the system is in a time advancing state, then the GTAN calculates the minimum delay from all the contributing concurrent procedural blocks and advances the simulation time by the minimum delay value. When an FSM is in a time stopping state, that FSM contributes zero delay value to the GTAN, thus stopping the time advance across the system. When a zero delay loop is encountered, additional behavioral clock cycles are consumed by the GTAN without any advancement of the simulation time.

A design may typically have few zero delay blocks, few finite delay blocks and few unknown delay blocks (such as a block that is waiting for some event to occur). All zero delay blocks may be executed in delta time without spending any simulation time. This means that simulation time may be stopped while zero delay blocks are executed. A time advance enable signal may be used to control the start/stop of simulation time. This time advance enable signal may be an input to all of the blocks that are waiting for completion of some finite time. The time advance enable signal would be true in any of the following conditions:

If execution is waiting for maturity of some finite delay (#delay construct);

If execution is waiting for some event on a signal (@ construct);

If execution is waiting on a signal that is zero (wait construct); or

If execution is at the end of an initial block.

All of the blocks that are waiting for the completion of some finite delay (delay primitive) will spend simulation time only if both the conditions mentioned below are true:

Local execution control is given to the finite delay statement in question; and

The time advance enable signal is set to indicate that no zero delay block is getting executed anywhere.

Thus, the time advance enable signal is a global input running across the hierarchies whose job is to synchronize the various procedural blocks.

Figure 5:
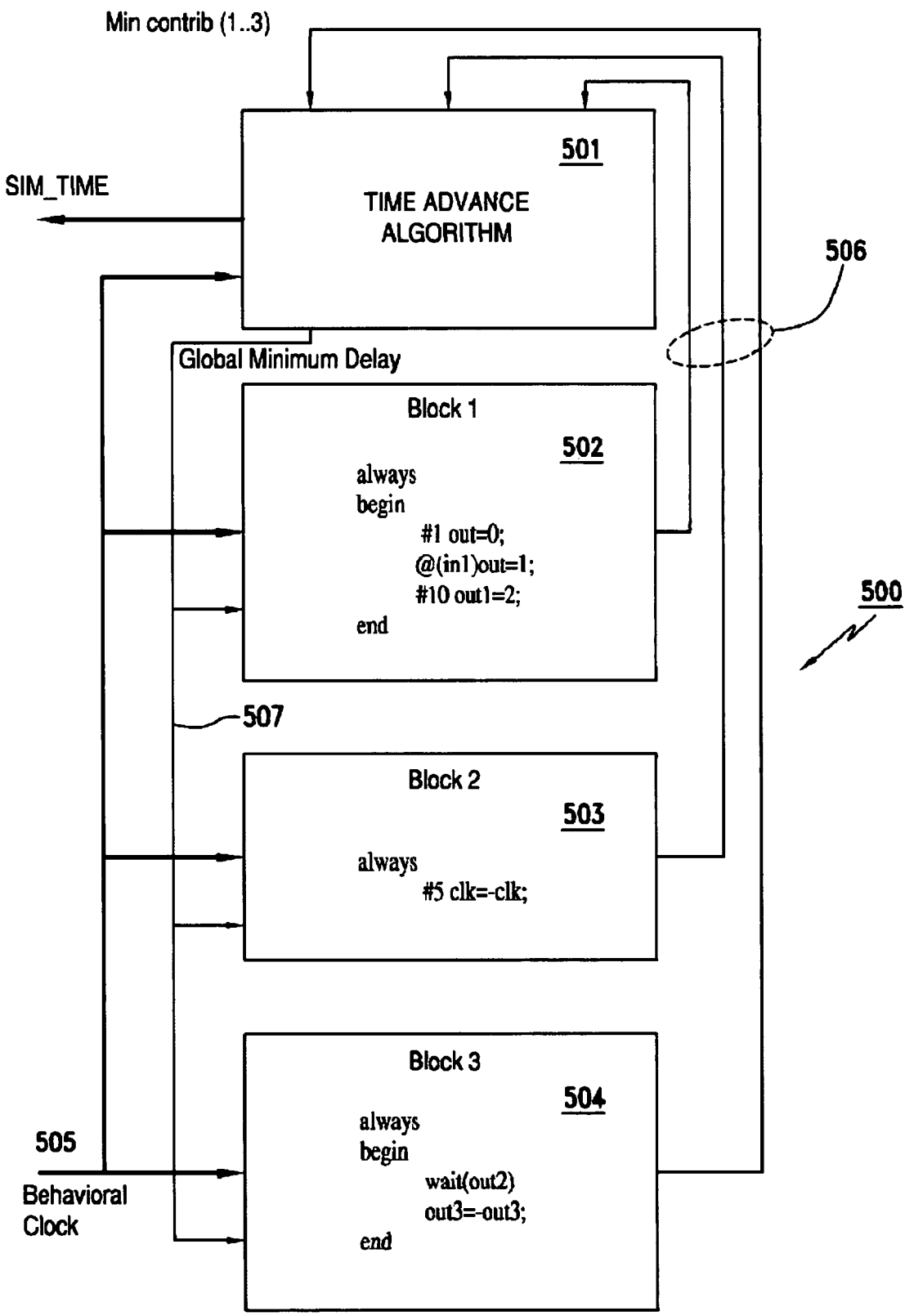
FIG. 5 is an illustrative functional block diagram of a Global Time Advance Network in accordance with at least one aspect of the present invention.

FIG. 5 shows how an illustrative GTAN 500 controls the execution of the FSMs of the concurrent blocks with respect to the simulation time. In this example, FSMs 502, 503, 504 of concurrent procedural blocks, as well as a GTAN time advance algorithm FSM 501, are timed using, and responsive to, a behavioral clock 505. The FSMs 502, 503, 504 inform the time advance algorithm FSM 501 about their respective delay states via communication paths 506, thereby contributing to the time queue maintained by the GTAN 500. The GTAN 500, and in particular the time advance algorithm FSM 501, calculates the global minimum delay of the network and advances the simulation time by that value. The time advance algorithm FSM 501 then communicates the determined global minimum delay to all the concurrent blocks via communication paths 507. This would cause those states with no more than the minimum time remaining for their maturity to transition to their next respective states.

Figure 6:
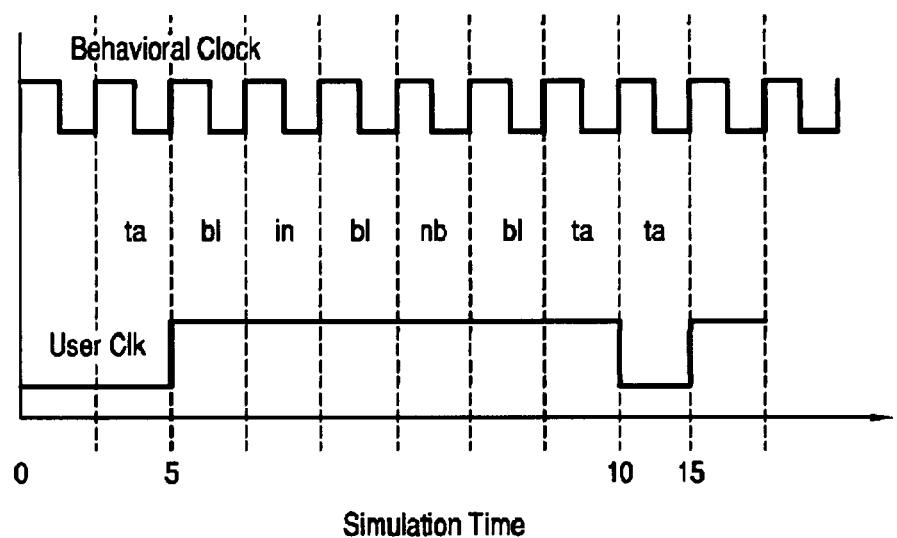
FIG. 6 is an illustrative timing diagram for a simulation cycle in accordance with at least one aspect of the present invention.

A simulation cycle may be expected to include a time advance cycle followed by zero or more zero-delay cycles. These zero-delay cycles may be blocking, non-blocking or internal cycles. The GTAN 500 may create a blocking cycle when wait/event-control statements mature as a result of signal value changes. When no more blocking cycles are required, the GTAN 500 may create a non-blocking cycle. Whether or not a non-blocking cycle is created would depend on whether there were any non-blocking assignments during the blocking activity. An internal cycle may be created when a concurrent procedural block requires a special state, e.g., a breaking state for a zero-delay data dependent loop. During internal cycles, wait/event-control state transitions may be suspended. FIG. 6 shows a timing diagram for an illustrative simulation cycle.

As previously mentioned, behavioral testbenches may be converted into RTL, which then may be mapped to a reconfigurable hardware platform using standard RTL synthesis and optimization techniques. Described below are examples of transformations from behavioral level to the RTL level of abstraction that may be implemented.

EXAMPLE

The following is an illustrative description of how a simple DUT-testbench pair might be created in accordance with various aspects of the present invention, and how a behavioral model may be transformed into a format suitable for being implemented on a reconfigurable hardware platform. In this example, the design being modeled is a simple switching system that is often used to control lights from the bottom and top of a staircase in a home. In particular, such a design has two switches that control the same light. If either of the switches is operated—that is, if the state of either switch changes—then the light also changes state. Thus, there are two inputs in this design, which are called herein switch1 and switch2. There is also one output, which will be called herein bulb_on. A Boolean logic expression that captures this design would be:

bulb_on=(switch1 is on AND switch2 is off) OR (switch1 is off AND switch2 is on).

Figure 13:
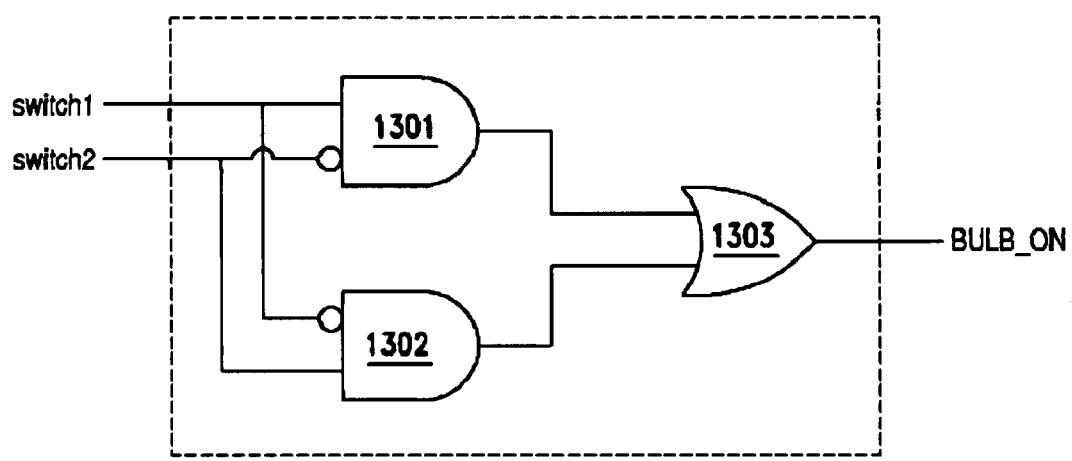
FIG. 13 is an illustrative schematic diagram of a logic design used to exemplify aspects of the present invention.

This logical expression is shown in terms of logic gates in FIG. 13, which shows two AND gates 1301, 1302 coupled to an OR gate 1303. The AND gates 1301, 1302 each receive the switch1 and switch2 inputs and output their results to the OR gate 1303. If either of the outputs of the AND gates 1301, 1302 is true, then the output of the OR gate 1303 is also true, meaning that bulb_on would be true (which means that the light would be in an on state).

The testbench in this example would be designed to generate all possible combinations of the two inputs, switch1 and switch2, and for each combination the output bulb_on would be checked to ensure that bulb_on is in the expected and correct state. A behavioral model for such a testbench may appear as follows:

```
DUT instance(switch1, switch2, bulb_on);
// Generate all possible scenarios and check the output for correctness.
initial
begin
    switch1 = 0; switch2 = 0;
    #1 ->check;
    switch1 = 0; switch2 = 1;
    #1 ->check;
    switch1 = 1; switch2 = 0;
    #1 ->check;
    switch1 = 1; switch2 = 1;
    #1 ->check;
end
// Check if output is correct.
always @(check)
begin
    if(switch1^switch2 != bulb_on)
        $display("FAILED: switch1 = %b, switch2 = %b,
        bulb_on = %b(expected =
        %b)", switch1, switch2, bulb_on, switch1^switch2);
end
```

Figure 14:
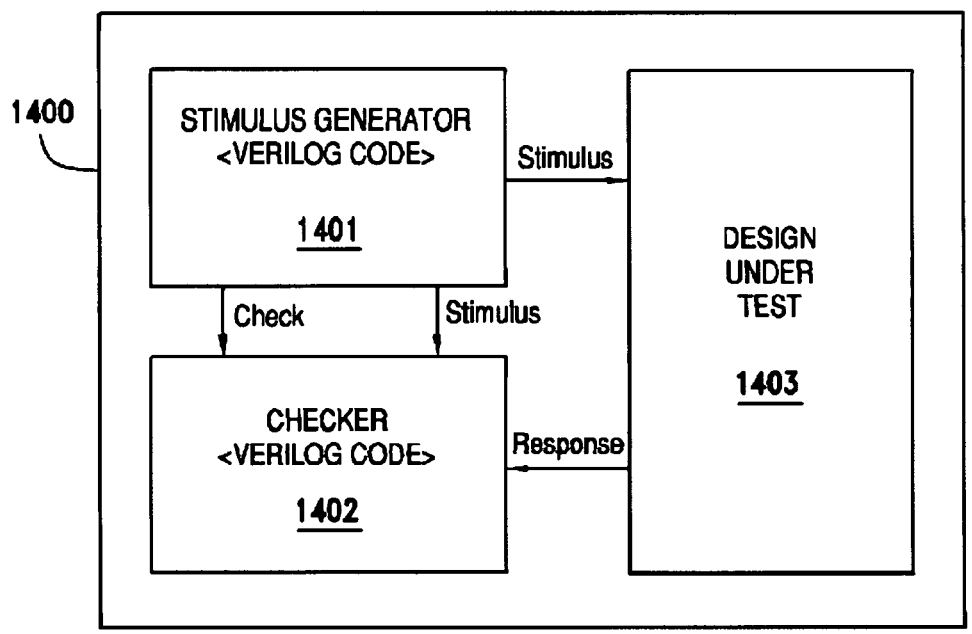
FIG. 14 is an illustrative functional block diagram of a reconfigurable hardware platform configured in accordance with at least one aspect of the present invention.

In accordance with aspects of the present invention, both the DUT and the testbench may be implemented onto the same reconfigurable hardware platform. Such a configuration is shown in FIG. 14, where a stimulus generator 1401, a checker 1402, and the DUT 1403 are all implemented on a reconfigurable hardware platform 1400 such as a hardware emulator.

Figure 15:
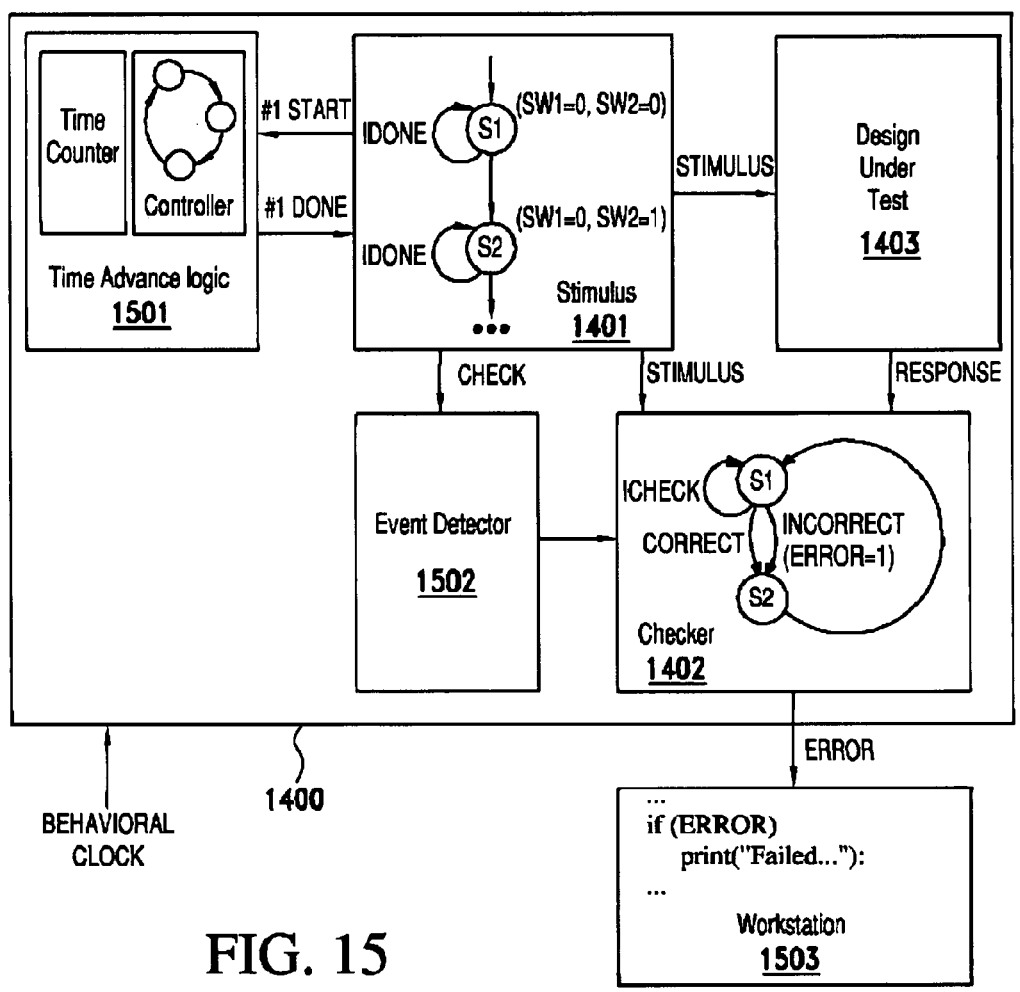
FIG. 15 is an illustrative functional block diagram of an emulation system in accordance with at least one aspect of the present invention.

Referring to FIG. 15, the stimulus generator 1401 and the checker 1402 may be implemented using finite state machines as shown. In addition, time-advance logic 1501 (which may be part of a GTAN), may be implemented. The time-advance logic 1501 provides the stimulus generator 1401 with a signal that signals completion of a unit delay (i.e., #1). In this simple example, the time-advance logic 1501 may simply be a time counter. A behavioral clock input is provided to the reconfigurable hardware platform 1400 in FIG. 15, and may be distributed to some or all of the various blocks therein. An event detector macro 1502 receives check signal that indicates whether it is time to for the checker 1402 to check the output of the DUT 1403. Also, a workstation 1503 may be coupled to the reconfigurable hardware platform 1400 for providing output, e.g., by printing, to a user when a failure occurs. In this way, the testbench can be mapped onto a reconfigurable hardware platform using a finite state machine/RTL level of abstraction running on a behavioral clock.

Timing Control Statements

The conversion of particular behavioral constructs into RTL will now be discussed. Timing control statements are commands/mechanisms that wait for an appropriate amount of simulation time to elapse. Once the condition in a timing control statement is satisfied, the wait is matured and normal flow of execution is restored. Three type of timing control statements are delay (#), wait, and event control (@). Delay statements specify the duration of time to wait for. Wait and event control statements provide mechanisms wherein execution waits until a specific change in a design signal is encountered. A wait statement matures, and thus execution resumes, only upon the condition being satisfied. An event statement matures, and thus execution resumes, only upon an appropriate change in the event expression such as the occurrence of an edge in a signal, which may be specified as a positive edge (posedge) or a negative edge (negedge). If more than one timing control statements are waiting simultaneously, then a delay statement will only mature if all of the event and wait statements at the current simulation time have matured.

FSMs may be used to implement a wait within a process. Each concurrent procedural block may be implemented as an implicit style FSM. Timing control statements/expressions may be mapped to the states in an FSM. For example, FIGS. 7A, 7B and 7C show examples of wait, delay, and event control statements mapped to FSMs 701, 702, 703, respectively. In FIG. 7A, the wait statement is "always wait(in) clk=~clk." In FIG. 7B, the delay statement is "always #5 clk=~clk." In FIG. 7C, the event control statement is "always @(in) clk=~clk." The 'done' signals in FIGS. 7B and 7C are generated by the GTAN 500. In the case of the wait and event statements (FIGS. 7B, 7C), a design signal change would mature the wait. In the case of the event statement (FIG. 7C), special logic 704 may be used to detect the particular kind of change (such as edge, posedge, negedge). The GTAN 500 maintains track of all of the active delays at any point in simulation time and matures the appropriate statements at the right time.

To prevent delay statements from maturing before concurrent wait and event statements, each wait and event statement transformation may also include special logic that interfaces with the GTAN 500. This logic may generate a hold_time_adv signal to the GTAN 500, ensuring that as long as any wait/event is maturing anywhere in the system, the GTAN 500 will not advance any delays. This situation is shown in FIG. 7C.

Zero-Delay Data Dependent Loops

A zero-delay data dependent loop is a loop with a dynamic termination condition and no-timing control statements in the body of the loop. During normal software simulation cycle, zero-delay loops are executed as one single activity. Until a zero-delay loop has completed being executed, the remainder of the simulation activity is frozen, i.e., simulation time is not advanced Thus, while a zero-delay loop is being executed, neither a wait statement, a delay statement, nor an event control statement can mature. Special consideration may need to be paid to zero-delay loops since much of the activity in the system may be expected to occur in parallel. Special logic may therefore be introduced to freeze the activity until a zero-delay loop has completed. This special logic may:

stop time advance cycles and wait/event maturity, and isolate the zero-delay loop block until such time as it completes its execution, i.e. the values updated in the zero-delay loop and the values updated in the design during execution are not visible to each other.

The combination of the above two steps would achieve the objective of freezing the relevant activity in the design.

To achieve the above, data dependent zero-delay loops may be treated as being in a time stopping state of a FSM. All the variables assigned in the zero-delay loop as well as signals that the zero-delay loop reads, may be assigned to a corresponding temporary variable during execution of the zero-delay loop. When the zero-delay loop terminating condition occurs, the final values of these temporary variables may be assigned to the appropriate registers. Special logic may be added such that a zero-delay loop interfaces with the GTAN 500 and ensures that no time advance or timing control maturity occurs during execution of the zero-delay loop. For example, as shown below, a zero-delay loop may be transformed from a behavioral model (shown on the left) into an RTL model FSM:

```
                          i = 0;
                          count_tmp = count;
                          i_tmp = i;
                          sum_tmp = sum;
                          while (i_tmp < count_tmp);
i = 0                       begin
while (i < count)              i_tmp = i_tmp + 1;
  begin                        sum_tmp = sum_tmp + i_tmp;
    i = i + 1      →           @ (posedge behavioral_clk);
    sum = sum + 1;          end
  ...                       i = i_tmp;
  end                       sum = sum_tmp;
                              out1 = out1_tmp;
                          ...
                          end
```

Named Events

Named events may be converted from a behavioral model to an RTL model FSM, as illustratively shown below.

```
event e1;                   reg e1;//initialized to 0
always @ (posedge clk)      always @ (posedge clk)
  -> e1;                      e1 = ~e1;
always @ (e1)       →       always
  out = in;                   begin
                                @ (e1);
                                out = in;
                              end
```

Hierarchical References

Verilog, for example, allows hierarchical references and access to wires and registers. During verification it may be desirable to maintain the hierarchy of the input design.

Both hierarchical reads and writes for all registers/wires/2-D arrays/memories may be implemented. Hierarchical reads are straightforward and no transformation is required (except for preserving the nets) as they generate a gate level netlist and therefore can be treated as any identifiers and compiled. Hierarchical wire assignments also do not require any transformation. Also, for hierarchical register assignments, if the assignment is from a unique scope, then no transformation is required. However, if the assignment is from other scopes (from its local scope and other scope) than a different strategy needs to be adopted. In this strategy, all the assignments may be made to a register visible in the local scope and then the same technique is applied that is used for multiple procedural assignments.

This transformation requires a pre-processing of the complete design before compilation. On a hierarchical write, a new register 'bypass_val,' for example, is created that is used to hold the new value that is being assigned. An event 'bypass_trig,' for example, is also created that is triggered whenever a hierarchical write occurs. An always block is added in the destination scope, which updates the actual register 'bypass' with 'bypass_val' based on the signal from 'bypass_trig'.

In the case of blocking assignments, all of the reads to the hierarchal registers within the assigning block refer to the local temporary register. This means that the local temporary register is updated with the actual register value after every timing control statement in the block. This need not be done for a hierarchical non-blocking write. An example of a transformation of a hierarchical reference is shown below:

```
module top;                      module top;
...                              ...
middle u_middle(..);             middle u_middle(..);
...                              ...
always                           always
begin                            begin
#1;                              #1;
...; // 0-delay-blk1      →      reg_value = u_middle.u_bottom.reg;
u_middle.u_bottom.reg = expr;    ...; // 0-delay-blk1
...; // 0-delay-blk2             reg_value = expr;
top_reg = u_middle.u_bottom.reg; ->reg_event;
...; // 0-delay-blk3             ...; // 0-delay-blk2
#2;                              top_reg = reg_value;
end                              ...; // 0-delay-blk3
endmodule                        #2;
                                 reg_value = u_middle.u_bottom.reg;
                                 end
                                 endmodule
                                 Module bottom will have a extra block:
                                 always @ (top.reg_event)
                                   reg = top.reg_value;
```

Force-Release and Procedural Assign/De-Assign

Force-release and procedural assign/de-assign constructs are semantically the same except that in case of both force and assign being active on the same register, the forced value takes precedence. Once a register is forced using a force statement, all procedural assignments on the register are skipped until the register is released again using a release statement.

Figure 12:
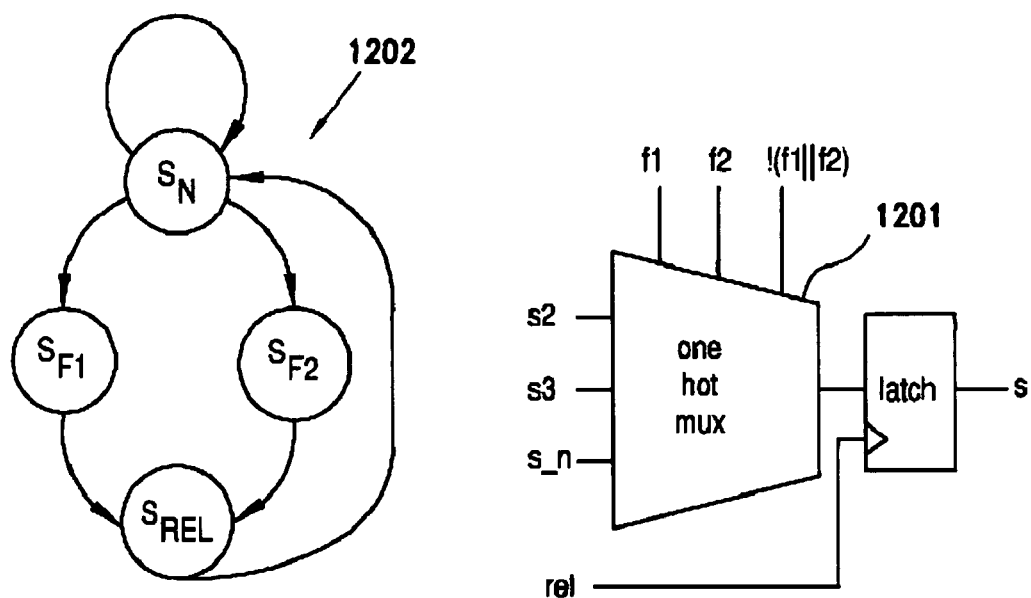
FIG. 12 is an illustrative functional block diagram showing a transformation of a force-release construct in accordance with at least one aspect of the present invention.

To compile the construct, the force-release constructs may be transformed into a multiplexer (MUX) 1201 and a controlling finite state machine (FSM) 1202 that generates various select signals for the MUX. Illustrative embodiments of the MUX 1201 and the FSM 1202 are shown in FIG. 12. Inputs to the MUX 1201 are the normally assigned values of the register and forced value of the register. A select input is asserted whenever the control flow reaches a force statement on the register. When the control reaches a release statement on the register, the FSM 1202, the FSM 1202 moves to a "released" state. When another normal assignment occurs on the register, the normal input of the MUX 1201 is updated and the select input is de-asserted. FIG. 12 illustrates the above transformation for force-release statements on a register. At any given point, the register can be in one of the three states, normally assigned (SN), forced (SF), or released (SREL). The register is initialized in the SN state. A force statement then moves the register to the SF state, and a release statement moves the register to the SREL state. At a later point, a normal assignment can then move the register back to the SN state. The MUX 1201 selects between the forced values and the normally assigned values depending upon the state of the register. In the release state, the latch on the MUX 1201 output, maintains the last forced value until a normal assignment takes place. For a wire, the sole difference is that the release state is not required, as in that case the normal assignment happens to be a continuous assignment which immediately takes effect. The same strategy is applied for the assign-deassign construct. Below is shown an illustrative transformation of a force/release construct.

```
always @ (t1 or t2)                 always @ (t1 or t2)
begin                               begin
    if (t1)                             if (t1)
        out1 = t2;                      begin
    else                                    out1_value = t2;
        out1 = ~t2;                         out1_release_active = 0;
    end                                 end
initial                             begin
begin                               else
    #3 force out1 = 0;                  begin
    #6 release out1;                        out1_value = ~t2;
end                                         out1_release_active = 0;
                                        end
                                    end
                                initial
                                begin
                                    #3 out1_force_value = 0;
                                    out1_force_active = 1;
                                    out1_release_active = 0;
                                    #6 out1_force_active = 0;
                                    out1_release_active = 1;
                                end always @ ((out1_release_active or
                                    out1_force_active or out1_force_value
                                    or out1_value)
                                begin
                                    out1 = out1_force_value ?
                                        out1_force_value :
                                        (out1_release_active ?
                                        out1_force_value :
                                        out1_value);
                                end
```

Fork-Join

Figure 18:
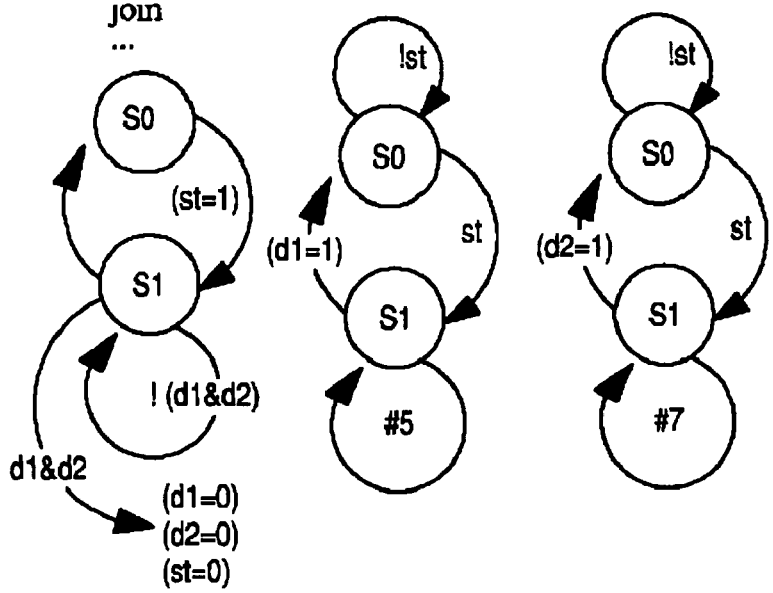
FIG. 18 is an illustrative finite state machine resulting from a transformation of a fork-join statement, in accordance with at least one aspect of the present invention.

A fork-join block is converted into a structural FSM where each branch of the fork-join statement represents one of a parallel set of child FSMs. The child FSMs wait for an enable to be asserted in their start state and indicate their completion to the parent FSM. The parent FSM asserts the enable simultaneously to all of the child FSMs when the control flow reaches the fork-join statement. The parent FSM then waits for the end state of each child FSM associated with a branch of the statement. Below and in FIG. 18 are shown an illustrative transformation in accordance with the principles just discussed.

```
always                      always
    begin                       begin
        ...                         ...
        fork                        start_branches = 1;
        #5 a = b;                   @ posedge BHVCLOCK;
        #7 b = c;                   while (!br1_end || !br2_end)
        join                            @ posedge BHVCLK;
        ...                         ...
    end                         end
                            always
                                begin
                            always
                                begin
                                    while (!start_branches)
                                        @ posedge BHVCLK;
                                    br!_end = 1;
                                end
                            always
                                begin
                                    // Similar code for branch 2
                                end
```

Behavioral Tasks and Functions

Figure 19:
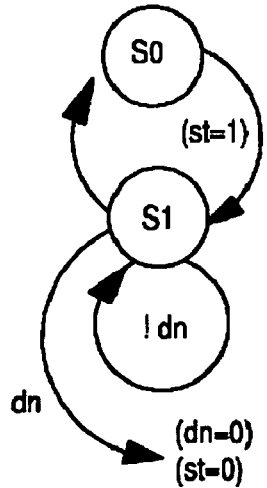
FIG. 19 is an illustrative finite state machine resulting from a transformation of a behavioral task/function, in accordance with at least one aspect of the present invention.
Figure 19:
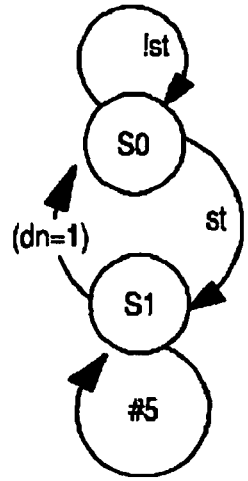

Behavioral tasks are defined as those tasks that require time advance within such tasks or that have data-dependent zero delay loops. Behavioral tasks and functions may require one or more behavioral clock cycles to execute and need to be transformed into FSMs. The compilation process for behavioral tasks and functions is similar to fork-join, where body of the task/function is converted into a FSM. This FSM is triggered from the parent FSM, when the control flow reaches the task/function invocation call, as shown for example in FIG. 19.

Inter-Block Disable Statements

Figure 20:
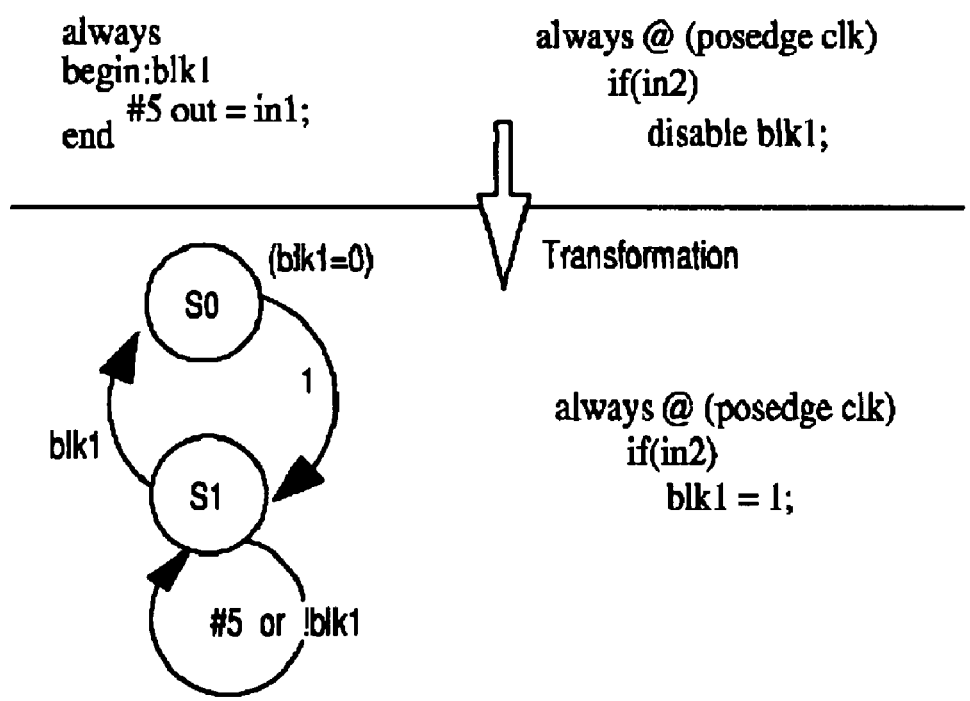
FIG. 20 is an illustrative finite state machine resulting from a transformation of an inter-block disable, in accordance with at least one aspect of the present invention.

Disabling from within a respective named block is common and is part of RTL synthesis. However, special transformations need to be implemented for handling inter-block disables. For compilation of inter-block disable statements all the named blocks which may be disabled are identified. For each such block, conditional disables are added in all user states within the block. The condition depends on the assertion of a special signal by the block enforcing the disable. A similar strategy may be adopted for those tasks that may be disabled by other blocks. This strategy is illustrated in FIG. 20.

Non-Blocking Assignments

Non-blocking procedural assignments do not block the execution flow for their completion. While handling a non-blocking assignment, the value to be assigned is set aside. After all the blocking assignments as well as all event/wait statements in the current simulation cycle have been completed/matured, this value is assigned to the target register(s). After this assignment, if new events/waits are to be matured they will be matured and new simulation cycle will start. As long as there are these simulation cycles, time cannot advance.

Figure 16:
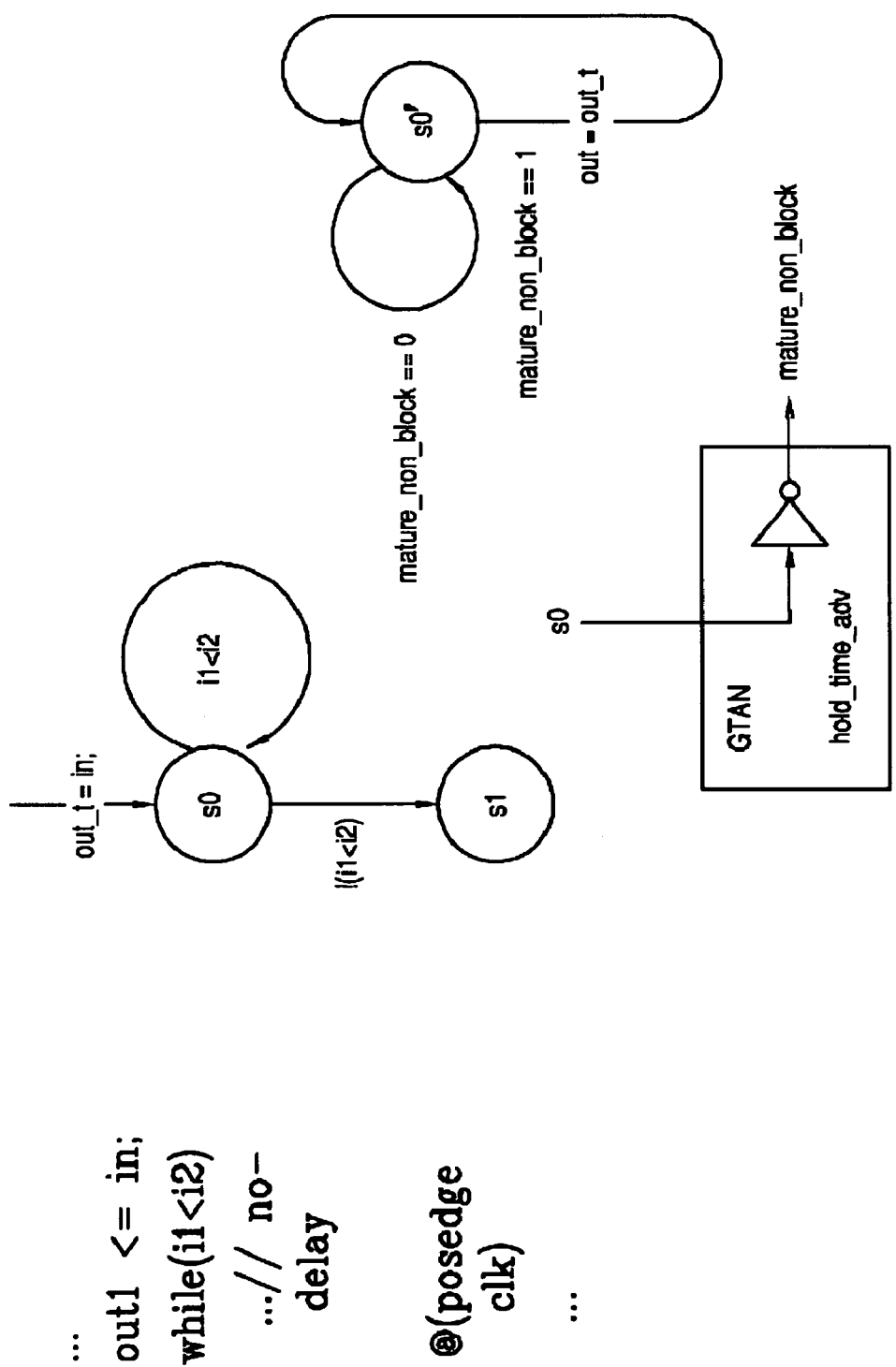
FIG. 16 is an illustrative representation of a finite state machine for managing non-blocking assignment, in accordance with at least one aspect of the present invention.

For non-blocking assignments in the behavioral modules, extra time stopping states are inserted. Non-blocking assignments are suspended until the GTAN 500 is ready to advance simulation time based on the control flow. Deferred values of non-blockingly assigned signals are stored in temporary registers. The temporary values are assigned to the actual register just before the next simulation cycle. This is illustratively shown in FIG. 16, and may be implemented by creating a temporary register for each register that has been assigned non-blockingly. The temporary registers hold any values scheduled to be assigned to the associated registers. Any non-blocking assignment to a register would thus actually immediately assign to its associated temporary register to keep the value to be assigned. Special logic is maintained by the GTAN 500 to keep track of exactly when to mature all non-blocking assignments.

When there are no event/wait statements maturing in the system anywhere, the GTAN 500 asserts a special signal mature_non_block. Each non-blockingly assigned register has special driving logic for it that keeps the register's value unchanged until this special signal is asserted after which it assigns the relevant temporary onto the register. Thus, after the assertion of this signal all non-blocking assignments pending in the current cycle are matured. At this point the GTAN 500 would again check if there are event/wait that need to be matured in the system. If not, the GTAN 500 will advance simulation time to the next simulation cycle.

$Time and Time Variables

Each time variable may be converted into a 64-bit (or other size) register. Since the GTAN FSM maintains the simulation time, $time is also available to the user. However, if there are many time variables and arithmetic operations on these variables, there may be significant compile time and a gate count penalty.

Multiple Driver Resolution

In case a register has multiple procedural assignments on it, the Verilog semantic is to use the last assigned value. This occurs irrespective of whether the different assignments were from the same procedural block or not. Although the use of multiple assignments on a register is rare in RTL designs, it is often used in testbenches. Where the assignment comes from multiple blocks at different simulation times, then the simulation results are well defined and are un-ambiguous. However, if these assignments occur during the same simulation time, then the simulation results would be ambiguous because the order in which the two assignments would be executed would not be defined. In this situation, special logic may be used to.

Figure 8A:
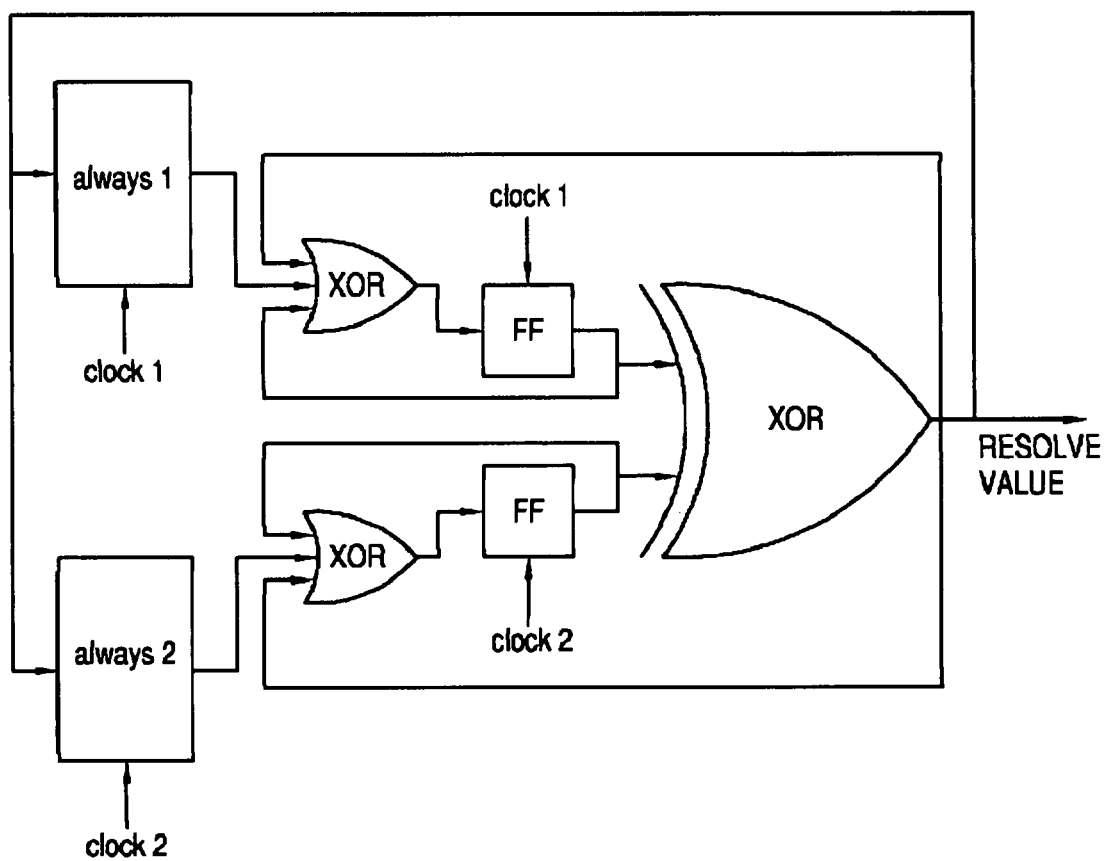
FIG. 8A is a schematic of a multiple driver resolution circuit using flip flops and XOR gates.

Traditionally, RTL synthesis tools have attempted to solve some special cases of this problem by using a special macro model using flip flops and XOR gates that can use two clocks and two data inputs and provide one output (hereinafter referred to as multi-clock macro), as shown for example in FIG. 8A. The behavior of this multi-clock macro is such that it can transfer data to the output when the associated clock arrives. And example of a multi-clock macro that can handle multiple procedural assignments is shown below.

```
always @(posedge clk1)
begin
    if(C1) register = in1;
end
always @(posedge clk2)
```

-continued

```
begin
    if(c2) register = in2;
end
```

A limitation with this approach is that it does not adequately handle cases where the two clock signals arrive at the same time, which may happen if the two clock signals are from the same clock. The results may not necessarily be ambiguous, however, because the two conditions c1, c2 may not be active at the same time.

Thus, newer techniques may be needed to solve the problem in general. These techniques may be employed at the back-end stages of the transformation where all processes have already been converted into CDFGs and then are being allocated into gates. The advantage of doing this is that no pre-processing is required before CDFG creation for such registers. The typical cases in multiple assignments are explained as follows.

CASE 1: two synchronous processes using different clocks. This case may be resolved using the multi-clock macro discussed above.

Figure 8B:
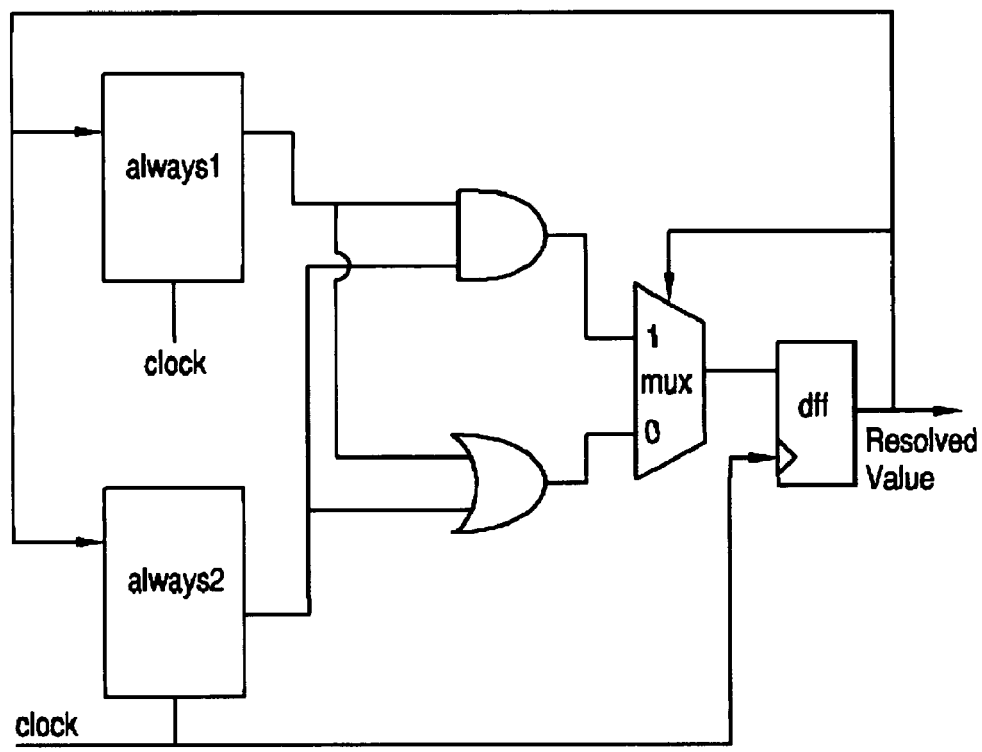
FIG. 8B is a schematic of an illustrative multiple driver resolution circuit in accordance with at least one aspect of the present invention.

CASE 2: two synchronous processes using same clock. As discussed earlier, such cases are un-ambiguous only if the assignments don't occur at the same simulation time. Thus, a special circuit may be used that produces correct results when the assignments are mutually exclusive in time. To explain the circuit, every process assumes that it is the only driver for a register and sends out the next cycle value for that register to a flip flop. In case there are two such processes, two next cycle values are being sent to this circuit. The circuit chooses the value that is different from the current value of the register. This works because if the next value is different from the current one it has to be due to an assignment from that process. FIG. 8B illustrates this arrangement.

CASE 3: two non-RTL processes. Recall that non-RTL processes are nothing but RTL processes synchronous with the behavioral clock. Thus, the solution applied to CASE 2 works in this case as well.

Zero Delay Cycles

In Verilog, special meaning has been assigned to the #0 statement (i.e., a zero delay cycles statement). Assignments that are scheduled non-blockingly cannot mature at #0. Thus, a #0 statement is a special zero delay cycle, which is similar to blocking zero delay cycles.

During a #0, the global minimum time advance may take a zero value. For this reason, a non-blocking maturity global signal also depends on the global minimum being non-zero to assert itself, thus ensuring that non-blocking zero delay cycles are deferred when #0 is being executed.

System Tasks/Functions

As mentioned earlier, system tasks/functions are implemented as remote procedural calls. The actual execution of these tasks may take place in the workstation 204. The procedural blocks view the system task call as any other behavioral task call. During such calls, all the activity in hardware may be suspended. A SCE-MI compliant transport mechanism may be used to enable these tasks. Special transactors (e.g., HDL at the reconfigurable hardware platform 201, and C at the workstation 204) may be created for both sides of the communication. These transactors may be broadly classified into two categories:

a) Tasks that do not return any values to the HDL side may be classified as one-way task or non-blocking tasks. HDL side execution need not wait for such tasks, as they are only messages to the workstation. These tasks require a single transaction to be sent from the HDL side to the C side. Examples of such tasks are display tasks ($display, $write etc).

b) Tasks that return values (such as $random, $fopen) may be classified as two-way tasks or blocking tasks. The HDL process that makes a blocking task call waits for its return before it resumes execution. Furthermore, such tasks use two transactions, one from the HDL side to the C side and the other from the C side to the HDL side that fetches the return values.

FIGS. 9 and 10 depict examples of one-way and two-way system tasks, respectively.

FIG. 11 illustrates an example of the system tasks infrastructure. On the reconfigurable hardware platform 201, an HDL transactor 1101 is coupled to all of the system tasks of the design 1102. At any point, the design 1102 can activate one or more system tasks. The HDL transactor 1001 uses an optimized queuing logic and sends tasks in series to the workstation 204. A C dispatcher receives these tasks and calls appropriate C functions. For example, a $display results in a printf (), whereas $random first generates a random number and then sends it back to the emulator. A call to a $random from the design 1102 puts the HDL transactor 1101 in the blocking state. Note that the transactor 1102 also controls the bhvclk input to the design 1102, and in its blocking state, the HDL transactor 1101 disables the design 1102. When a random number is received from the C side, the HDL transactor 1101 releases the blocking state and enables the bhvclk input.

Figure 17:
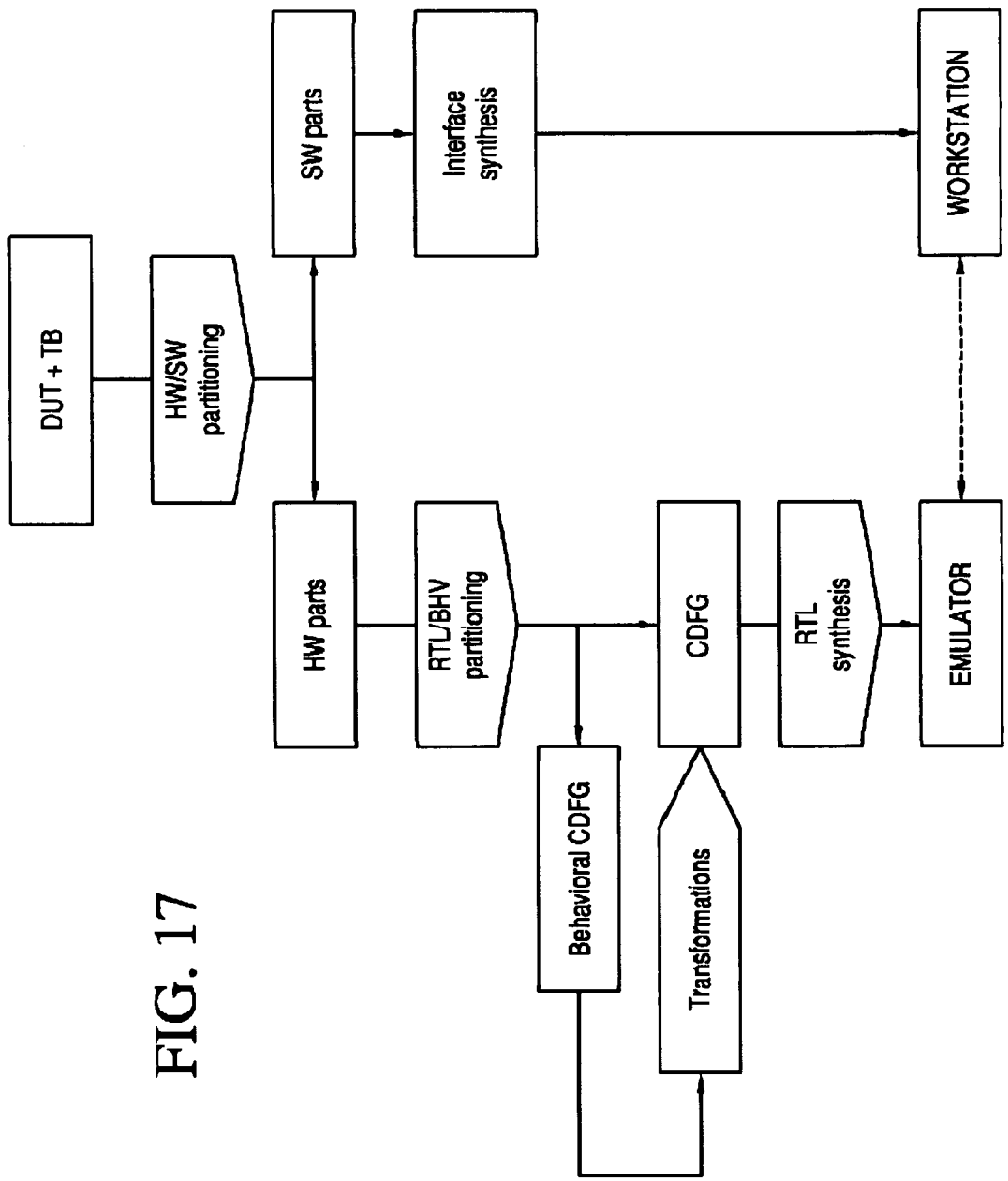
FIG. 17 is an illustrative functional block diagram of a system in accordance with at least one aspect of the present invention.

Up to now it has been described at a conceptual level how behavioral HDL is transformed into an intermediate RTL representation. An illustrative system that implements the transformations described previously may be created as shown in FIG. 17. Such a system takes the DUT (described in RTL HDL) and the testbench (described in behavioral HDL) and partitions the DUT into portions that need to execute on the emulator and portions that execute on the workstation. For the portions that execute on the emulator, the transformations described so far may be used to convert the behavioral HDL into an intermediate RTL representation. This RTL representation is known as the Control Data Flow Graph (CDFG) in traditional RTL synthesis tools. The conversion involves an intermediate representation known as Behavioral Control Data Flow Graph which then may be converted into the CDFG. The RTL portions of the design may be directly converted into CDFG. This combined CDFG may then be taken through traditional RTL synthesis process and converted into emulation netlist. At this point, interface synthesis (transformations for the system tasks that require dynamic support from workstation) may be performed, and the interfaces for the two sides may be created that enables the communication between the workstation and the emulator when the design is simulated.

What is claimed is:

1. A method for verifying a circuit design by mapping a circuit design and an associated testbench onto a reconfigurable hardware platform, said method comprising the steps of:

synthesizing the circuit design into a structural model;

mapping the structural model of the circuit design onto a reconfigurable hardware platform;

transforming a behavioral model of a testbench into a structural model maintaining exact simulation semantics of the behavioral model, said structural model including a plurality of finite state machines (FSMs) corresponding to each time advancing and time non-advancing block of code in said behavioral model;

mapping and executing said finite state machines onto the reconfigurable hardware platform, generating a global scheduler for synchronized execution of said finite state machines;

automatically partitioning portions of said structural model of the testbench for execution on a sequential computation platform; and automatically synthesizing an interface for interaction between the reconfigurable hardware platform and the sequential computation platform to enable execution of said portions partitioned by the computation platform.

2. The method as claimed in claim 1, wherein said circuit design is described in at least one of Verilog and VHDL.

3. The method as claimed in claim 1, wherein the behavioral model of the testbench is described in Verilog.

4. The method as claimed in claim 3, wherein the structural model of the testbench is synchronous to a clock signal.

5. The method as claimed in claim 3, wherein the structural model of the testbench includes a register for maintaining simulation time.

6. The method as claimed in claim 5, wherein the register updates non-monotonically relative to the clock signal.

7. The method as claimed in claim 5, wherein during at least some cycles of the clock signal there is no change in the register.

8. The method as claimed in claim 5, wherein during at least some cycles of the clock signal there is no change in the register due to triggering of an event(@) statement.

9. The method as claimed in claim 5, wherein during at least some cycles of the clock signal there is no change in the register due to maturing of a wait statement.

10. The method as claimed in claim 5, wherein during at least some cycles of the clock signal there is no change in the register due to completion of an iteration of a zero time unbounded looping statement.

11. The method as claimed in claim 3, wherein the simulation semantics are associated with ordering of events and signal assignments.

12. The method as claimed in claim 11, wherein said signal assignments include at least one of a blocking delta delay, a non-blocking delta delay, and a #0 construct.

13. The method as claimed in claim 1, wherein blocking and non-blocking assignments occur after blocking and non-blocking delta delays, respectively.

14. The method as claimed in claim 1, wherein the simulation semantics are associated with procedural assignments on a register from multiple processes.

15. The method as claimed in claim 1, wherein the simulation semantics are associated with force/release statements.

16. The method as claimed in claim 1, wherein the simulation semantics are further associated with a hierarchical write on a register.

17. The method as claimed in claim 1, wherein the simulation semantics are further associated with a hierarchical force/release on a register.

18. The method as claimed in claim 1, wherein the simulation semantics are further associated with use of non-RTL tasks.

19. The method as claimed in claim 1, wherein the simulation semantics are further associated with non-RTL functions.

20. The method as claimed in claim 1, wherein the simulation semantics are further associated with data-dependent zero time loops.

21. The method as claimed in claim 1, wherein the simulation semantics are further associated with a fork-join statement.

22. The method as claimed in claim 1, wherein the simulation semantics are further associated with disabling a name block externally from another process.

* * * * *